United States Patent [19]

Milkovic

[11] 4,092,592
[45] May 30, 1978

[54] ELECTRONIC KWH METER HAVING VIRTUAL GROUND ISOLATION

[75] Inventor: Miran Milkovic, Scotia, N.Y.

[73] Assignee: General Electric Company, Somersworth, N.H.

[21] Appl. No.: 757,801

[22] Filed: Jan. 7, 1977

[51] Int. Cl.$^2$ ............................................. G01R 21/06
[52] U.S. Cl. .................................. 324/142; 324/140 R
[58] Field of Search ........................... 324/142, 140 R; 328/158, 160

[56] References Cited

U.S. PATENT DOCUMENTS

| 3,875,509 | 4/1975 | Milkovic | 324/142 |
| 3,953,795 | 4/1975 | Brunner | 324/142 |
| 3,976,941 | 8/1976 | Milkovic | 324/142 |
| 3,976,942 | 8/1976 | Mayfield | 324/142 |

Primary Examiner—John Kominski
Attorney, Agent, or Firm—Robert E. Brunson; Francis X. Doyle

[57] ABSTRACT

An electronic kWh meter is disclosed which measures electrical energy consumed in an electrical system. A current transformer generates an analog voltage which is proportional to a current in the electrical system. An operational amplifier has an input resistor connected across the load impedance of the electrical system and has a feedback resistor connected across the input and output of the amplifier. The input resistance of the amplifier is very small compared to the resistance of the input resistor to thereby virtually isolate the operational amplifier from the electrical system. The operational amplifier generates an output signal which is proportional to the voltage across the load impedance in the electrical system. The inphase components of the voltage and current are multiplied to provide a signal which is proportional to the instantaneous power in the system. This signal is converted to a pulse train wherein each pulse represents a quantized amount of energy consumed within the system. The pulse train is accumulated, recorded, and a display is provided for indicating the energy being consumed within the system. Both single phase and polyphase embodiments of the meter are described.

9 Claims, 2 Drawing Figures

4,092,592

ELECTRONIC KWH METER HAVING VIRTUAL GROUND ISOLATION

BACKGROUND OF THE INVENTION

This invention relates to an electronic kWh meter for measuring energy in an electrical system, and more specifically, relates to a meter which does not require a potential transformer to detect and measure power and energy being consumed within an electrical system.

This invention relates to the metering of electrical energy in terms of, for example, kWh in an electrical system. Electrical energy in terms of kilowatt hours, or kWh, has been and continues to be metered with the rotating disc-type of meter which is disclosed in, among other sources, the "Electrical Meterman's Handbook", Chapter 7, 7th Ed., published 1965 by the Edison Electric Institute. The invention hereinafter disclosed represents a departure from the methodology and apparatus exemplified by the rotating disc-type meter. In addition, those who are familiar with the instrumentation and metering arts respecting electrical power and energy know of proposed systems including apparatus employing electronic and solid state devices for measuring power and energy. In such apparatus, the electronic and solid state devices replace the conventional rotating disc. Thus, in prior art systems, the current flowing through a line and the voltage across a load impedance connected to the line are each detected, and signals representing these parameters are coupled to a pulse width amplitude multiplier. The multiplier generates an output signal which is proportional to the product of the detected current and voltage. This signal is then averaged by means of a low-pass filter to provide a D.C. voltage having an amplitude which is proportional to the total average power of the electrical system. This D.C. voltage is converted to a pulse train by means of an analog-to-pulse rate converter, which pulse train has a variable signal repetition rate $f$ which is proportional to the average power in the system with each output pulse signal representing a constant quantized amount of electrical energy. The output pulse train is then coupled to a display mechanism which may, for example, include a counter or register which performs conventional accumulation, storage and display functions. An example of one such kWh meter is disclosed in Milkovic U.S. Pat. application Ser. No. 505,798, now U.S. Pat. No. 3,961,257. A drawback to such a metering system is that both a current and a potential transformer are required for each phase being measured in the electrical system. Because potential transformers are expensive, there is a need in the art for providing an improved method and apparatus for detecting voltage levels within the system without requiring one or more potential transformers.

It therefore is an object of this invention to provide an improved electronic kWh meter for measuring electrical energy wherein the need for a potential transformer is obviated.

SHORT STATEMENT OF THE INVENTION

Accordingly, this invention relates to an electronic kWh meter for measuring energy consumed in an electrical system, wherein the apparatus includes a current transformer for generating an analog voltage which is proportional to a current in the system. An operational amplifier has an input resistor connected to a current-conducting line in the electrical system and has a feedback resistor connected across the input and output of the amplifier. The input impedance of the amplifier, which is the ratio of the value of the feedback resistor to the open-loop amplification factor of the operational amplifier, is much less than the resistance of the input resistor. Accordingly, the operational amplifier is virtually isolated from the electrical system. The output of the operational amplifier is proportional to the voltage across the current-conducting line. This voltage being multiplied by the current proportional signal in a multiplier circuit. The output of the multiplier is a signal which is proportional to the instantaneous power in the electrical system. This signal is converted to a pulse train by an analog-to-pulse rate converter wherein each pulse corresponds to a quantized amount of energy consumed in the electrical system. The output of the analog-to-pulse rate converter is accumulated, stored and displayed.

In order to measure energy consumed in a polyphase system, one current transformer is provided for each phase of the system, and a corresponding operational amplifier is provided for each phase of the system. The outputs of the respective operational amplifiers and current transformers are multiplied, summed and converted to a pulse train, with the pulse train indicating the total energy consumed within the polyphase electrical system.

BRIEF DESCRIPTION OF THE DRAWINGS

Other objects, features and advantages of the present invention will now become more fully apparent from the following detailed description of the preferred embodiments, appended claims and the accompanying drawings in which:

DETAILED DESCRIPTION OF THE PREFERRED EMBODIMENT

Figure 1:
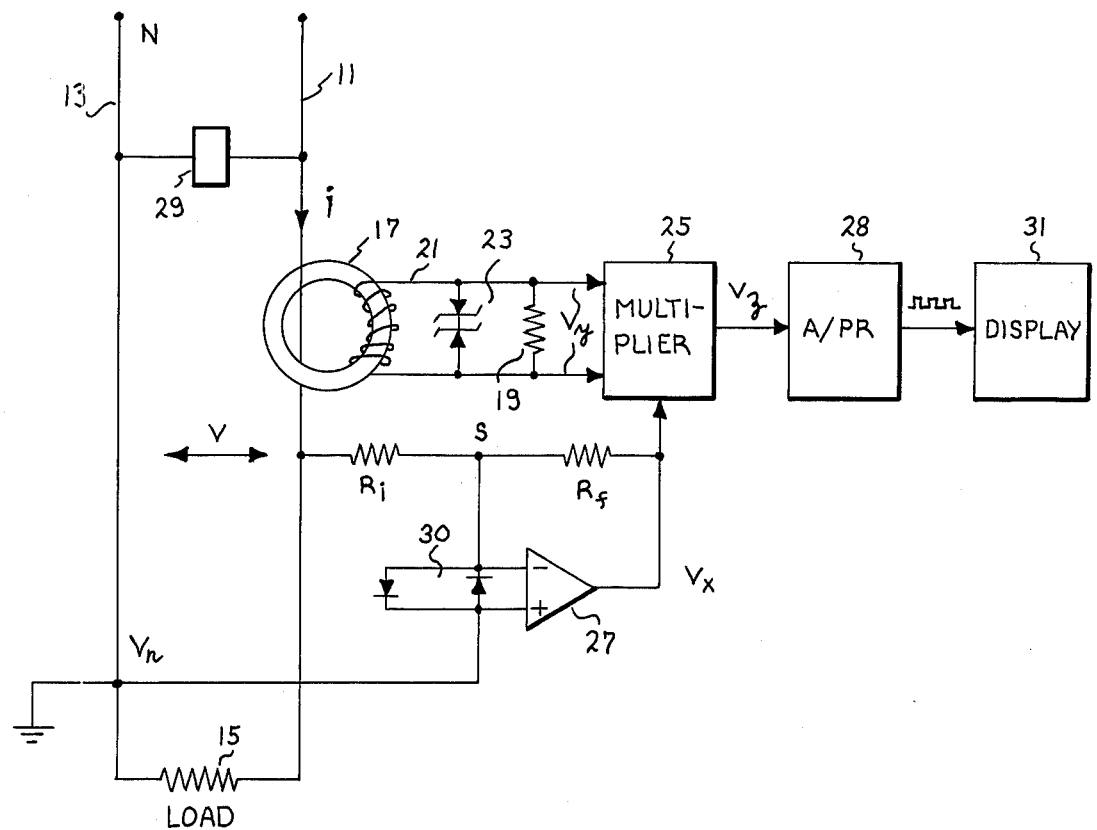
FIG. 1 is a schematic block diagram of the metering system of the present invention.

Refer now to FIG. 1 where there is a schematic block diagram of one preferred embodiment of the present invention. The electrical system in which power and energy are being measured by the meter of the present invention may be of any type including, for example, a conventional 60 Hz power distribution system. Further, the electrical system may be single phase or polyphase. The electrical system is represented by the phase line 11 and a neutral line 13 with a load resistance 15 being connected thereacross. It should be understood that in a generalized case, the load will have some inductance and capacitance to thereby cause a relative phase shift between the current $i$ and the voltage V in the system. However, for purposes of describing the present invention, it will be assumed that the load is a pure resistance. Also, as illustrated, the neutral line 13 is designated as establishing the reference potential which will hereinafter be termed ground.

The current flow $i$ in line 11 is detected by current transformer 17. A resistor 19 is connected across the secondary 21 of the current transformer 17 and serves to establish a voltage $V_y$ which is proportional to the instantaneous current $i$ flowing through the electrical system. A pair of Zener diodes 23 are connected across the secondary 21 for providing transient voltage protection. The voltage $V_y$ is connected to a multiplier circuit 25 which will be described more fully hereinbelow in connection with the description of the embodiment of FIG. 2.

An operational amplifier 27 has an input resistor $R_i$ and a feedback resistor $R_f$. The input resistor $R_i$ is connected to line 11 of the electrical system at one end, and is connected to the phase-inverting input of the amplifier 27 at its other end. The feedback resistor $R_f$ is connected across the input and output terminals of the operational amplifier 27. The non-phase inverting input of the operational amplifier 27 is connected to the neutral phase line 13 of the electrical system. A pair of transient suppression diodes 30 are connected across the input terminals of the amplifier 27 to provide increased system reliability. The input impedance to the operational amplifier, as is known in the art, is $R_f/A_o$ wherein $A_o$ is the open-loop gain or amplification factor of the amplifier 27. If $A_o$ is large and $R_i$ is much greater than $R_f/A_o$, then only a small fraction of the voltage V across load 15 will appear at the summing point S of the operational amplifier. The value of this voltage is typically less than one millivolt, thereby resulting in the summing point S being at virtual ground potential $V_N$. Thus, the operational amplifier 27 is virtually isolated from the electrical system in which energy consumption is being measured. The output voltage $V_x$ of the operational amplifier 27 is equal to $V(R_f/R_i)$ and, accordingly, is proportional to the instantaneous voltage across the load 15. This voltage $V_x$ is coupled to the multiplier 25. In order to provide further transient protection for the system, a metal oxide varistor 29 is provided across the load 15.

The multiplier effectively multiplies the voltages $V_x$ and $V_y$ to derive an output signal $V_z$ which is proportional to the instantaneous power in the electrical system. This voltage is integrated and converted to a pulse train by an analog-to-pulse rate converter 28 which will be explained more fully in connection with the description of the embodiment of FIG. 2. Each pulse in the pulse train corresponds to a quantized amount of electrical energy being consumed in the electrical system. The pulse train is coupled to an accumulation, recording and display circuit 31 which may be of any type known in the art. The display system 31 accumulates the pulses generated by the analog-to-pulse converter 28 and provides a cumulative display indicating the total amount of energy consumed in the electrical system.

Figure 2:
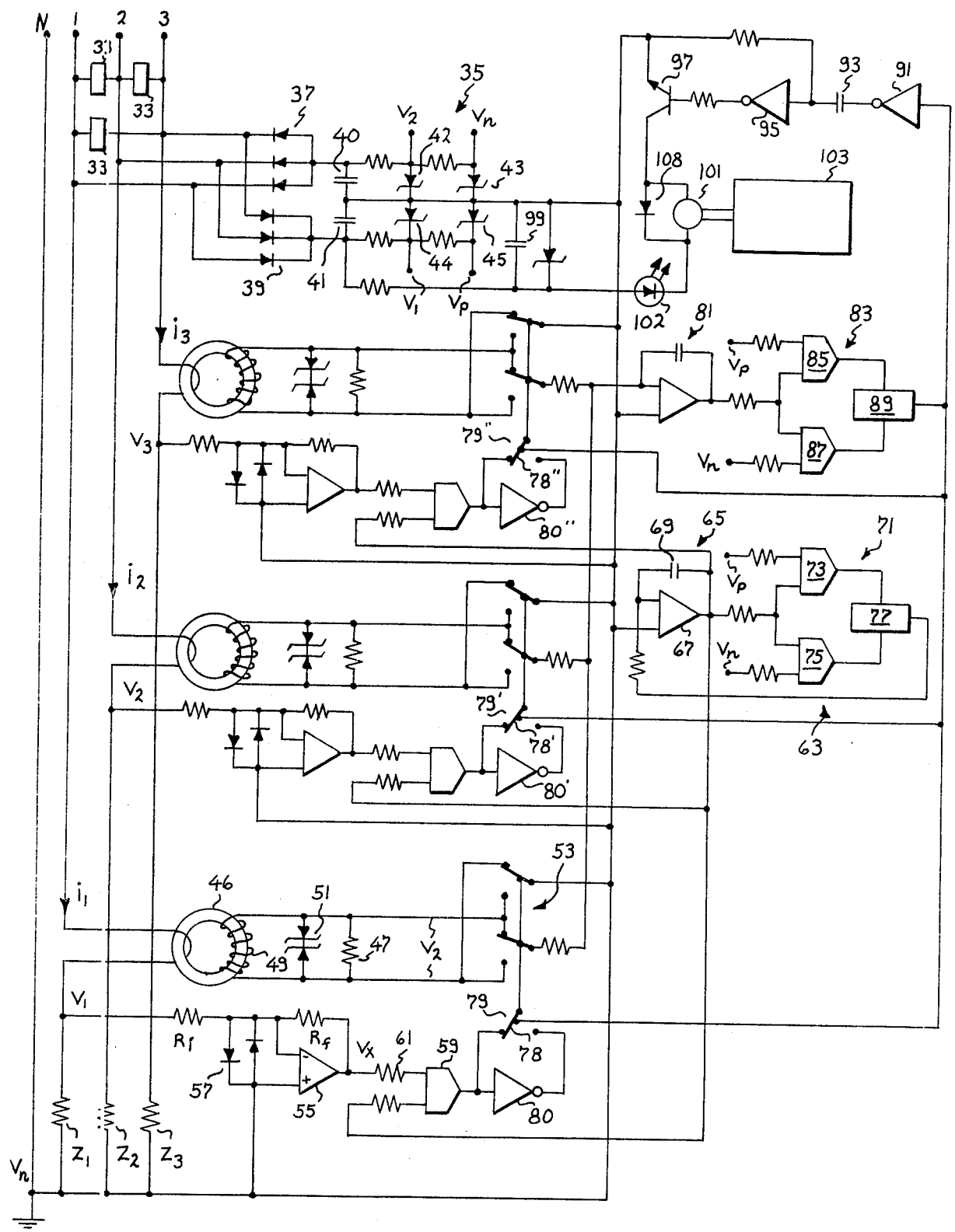
FIG. 2 is a more detailed schematic block diagram of an embodiment of the invention capable of measuring the consumption of energy in a polyphase electrical system.

Refer now to FIG. 2 where there is a more detailed disclosure of the metering system of the present invention capable of metering energy consumption in a polyphase system. The electrical system includes a neutral phase wire N which is at a reference potential hereinafter designated ground, and three phase lines 1, 2 and 3. Each phase line has a load impedance $Z_1$, $Z_2$ and $Z_3$, respectively, with the voltage across impedance $Z_1$ being $V_1$ and the current therethrough being $i_1$, and so on. In order to provide for transient protection in the metering system, a metal oxide varistor 33 is connected between each phase of the electrical system.

In order to provide D.C. power supply voltages for the various active elements in the metering system, a power supply generally designated by the numeral 35 is required. The power supply includes a rectifier arrangement which includes diodes 37 and 39 which rectify the A.C. voltage in the three phases of the polyphase electrical system. The output of the diode rectifiers 37 is connected to a filter capacitor 40, while the output of the diode rectifiers 39 is connected to a filter capacitor 41. The filter capacitors 40 and 41 are connected to each other and to the reference potential $V_N$. As illustrated, Zener diodes 42 – 45 define four different voltage levels to thereby provide at the respective output terminals, the positive D.C. voltages $V_1$ and $V_p$ and the negative voltage levels $V_2$ and $V_n$. It should be appreciated that a more sophisticated power supply could be provided including a regulator circuit of conventional design. However, for purposes of illustration, the simplified power supply circuit 35 is illustrated herein.

In the ensuing description of the invention, the operation of the meter for measuring instantaneous power in one phase of the polyphase system will be described in detail. It should be understood and appreciated that the method of measuring instantaneous power in the other two phases will be the same as that for the phase described. Various components of the metering system for each phase will be identified by identical numerals and letters, except that the second and third phase will be distinguished by the use of primes and double primes, respectively. With respect to the first phase, the current flow through the load $Z_1$ is detected by current transformer 46. A resistor 47 is connected across the secondary 49 of the current transformer 46 to thereby establish a voltage $V_y$ which is proportional to the instantaneous current $i_1$ passing through the load impedance $Z_1$. In order to prevent damage due to transient peaks, a pair of Zener diodes 51 are connected across the secondary 49. The voltage $V_y$ is coupled to a multiplier which, in the preferred embodiment, is a bipolar switching circuit 53. As illustrated, the bipolar switching circuit 53 is mechanical in nature. However, it should be appreciated that, in the preferred embodiment, the switch 53 could be electronic, using conventional CMOS FET circuitry.

In order to detect the voltage $V_1$ across the impedance $Z_1$, an operational amplifier 55 is provided which has an input resistor $R_i$ connected to one side of the load impedance $Z_1$ and connected at its other end to the inverting input of the operational amplifier 55. A feedback resistor $R_f$ is connected across the operational amplifier 55. The in-phase input of the operational amplifier 55 is connected to the other side of the impedance $Z_1$, i.e., connected to reference potential. A pair of diodes 57 are connected across the input terminals of the amplifier 55 to suppress transient spikes. As aforementioned in connection with the description of the meter of FIG. 1, the resistance $R_i$ is much greater than the input resistance $R_f/A_o$ of the operational amplifier. It will be recalled that the parameter $A_o$ is the open-loop amplification factor of the operational amplifier. The operational amplifier 55 is thus virtually isolated from the electrical system, and provides at its output a voltage $V_x$ which is proportional to the voltage $V_1$ in the first phase of the electrical system. The voltage $V_x$ is coupled to one input of a comparator 59 via input resistor 61. The other input to the comparator 59 is a relatively high frequency triangular waveform generated by triangular waveform generator 63.

Generator 63 includes an integrator 65 which includes an amplifier 67 and a feedback capacitor 69. The output of the integrator 65 is coupled to a pulse generator 71 which includes comparators 73 and 75 and a bistable flipflop 77. The output of the flipflop 77 is connected back to the input of the integrator 65. In operation, assume that the integrator is integrating upwardly in a positive direction, i.e., generating the positive-going portion of the triangular waveform. When the output voltage of the integrator reaches a voltage level $V_p$, comparator 73 generates an output pulse to set the flipflop 77. A pulse is thereby derived at the output of flipflop 77 which causes the integrator 65 to start integrating downwardly. As the integrator integrates downwardly, i.e., generates an output voltage which goes in a negative direction, the negative-going portion of the triangular waveform is generated. When the integrator provides an output voltage which reaches a level $V_n$, the comparator 75 generates an output signal for resetting the flipflop 77. When this occurs, the output of the flipflop 77 is switched to thereby cause the integrator to integrate upwardly again. This cycle repeats itself at a fairly rapid rate compared to the frequency of the line voltage in the electrical system. As an example, in the preferred embodiment the line voltage may be the conventional 60 cycle voltage provided in electrical distribution systems. In such a case, the triangular waveform generator 63 preferably generates a triangular waveform having a frequency of up to 10 kHz.

Referring back to the comparator 59, the output of the comparator is a pulse train wherein each of the pulses has a time duration which is proportional to the instantaneous amplitude of the line voltage in the electrical system being measured. Thus, the output of the comparator 59 is a pulse width modulated signal having a duration which is proportional to the line voltage $V_1$. This signal is coupled to switching circuit 53 via switch 79. Switch 79 is shown in mechanical form. However, it should be appreciated that this switch can be a suitable electronic switching circuit of a type well known in the art.

The output of the comparator 59 controls the position of the switch arms of the switch 53. Thus, as illustrated, with switch arm 78 of switch 79 closed on the output terminal of the comparator 59, the switch arms of switch 53 are closed, as illustrated, to couple the voltage $V_y$ to the integrator circuit 81 when the output of the comparator 59 is, for example, high. When the output of the comparator 59 goes low, the switch arms of switch 53 are rotated into the down position and, accordingly, a voltage $-V_y$ is coupled to the input of integrator 81. It can be seen that the switch 53 serves to connect either the voltage $V_y$ or $-V_y$ to the input of the integrator circuit 81, depending upon the output of the comparator 59. This signal is a chopped analog signal having an instantaneous amplitude which is proportional to the magnitude of the current $i_1$ and has a width proportional to the in-phase magnitude of the voltage $V_1$. Thus, the input to the integrator circuit 81 is proportional to the instantaneous power in the first phase of the polyphase system. The power in the second phase, i.e., phase two, is also coupled to the integrator circuit 81 as is the instantaneous power in the third phase, i.e., phase three, of the polyphase system. The manner in which the instantaneous partial power in each of these phases is derived is the same as was derived by the circuitry described in connection with the first phase of the system. As aforementioned, corresponding components of circuitry in each of the second and third phases is designated by like numerals, but distinguished by the primes and double primes, respectively.

The output of the integrator 81 which is proportional to the energy being consumed in the polyphase system is coupled to a phase generating circuit 83. The circuit 83 is similar to the phase generator 71 and includes a pair of comparators 85 and 87 and a flipflop circuit 89. In operation, assume that the integrator 63 is integrating in a positive direction. When the voltage at the output of the integrator equals $V_p$, the comparator 85 generates an output signal for setting the flipflop 89. A pulse is thus generated which is coupled to the switches 79, 79' and 79''. Thus, the switch arms 78, 78' and 78'' are rotated into engagement with the output terminals of the inverters 80, 80' and 80''. Thus, the polarity of the output of the comparator 59 is reversed, resulting in a shifting of the phasing of the switches 53, 53' and 53''. This causes the integrator 81 to integrate downwardly. As the output of the integrator decreases to the negative voltage level $V_n$, comparator 87 provides an output pulse for resetting the flipflop 89. This results in an output which re-establishes the switch arms 78, 78' and 78'' in contact with the outputs of the comparators. The cycle then repeats itself. Thus, during the up and down integration process, error signals due to offset voltages resulting from the integration process are averaged out. This improves the dynamic range of the electronic kilowatt hour meter of the present invention.

The output of the pulse generating circuit 83 is also coupled to inverter 91 which inverts the pulse signal. Capacitor 93 differentiates the pulse signal, with this signal being again inverted by inverter 95 and utilized to drive power transistor 97. When power transistor 97 is turned on, the voltage $V_s$ stored by capacitor 99 is connected across the windings of stepping motor 101 and across a light emitting diode 102. The resulting current flow through the winding 101 drives the stepping motor a predetermined amount to thereby advance a mechanical recording and display unit 103. When transistor 97 is turned off after capacitor 93 has become charged, further current conduction through motor 101 is inhibited to thereby permit only a predetermined incremental movement of the motor 101 for each pulse generated by the analog-to-pulse rate converter 83. Thus, the recording and display unit 103, which may be of any type known in the art, effectively accumulates, records and displays the energy consumed in the polyphase system. The light emitting diode 103 is for the purpose of indicating operation of the metering system, and the diode 105 prevents breakdown voltage spikes across the windings of the motor 101.

While the present invention has been disclosed in connection with a preferred embodiment thereof, it should be appreciated that there may be other alternate embodiments of the invention which fall within the spirit and scope thereof as defined by the appended claims.

What is claimed is:

1. An electronic meter for measuring energy consumed in an electrical system of the type having a load impedance connected across reference and current carrying conductors of said system comprising:
   a. means coupled to a current carrying conductor of said electrical system for generating an analog signal having a value proportional to a current in said electrical system;
   b. an operational amplifier, said operational amplifier having a feedback resistor connected across input and output terminals thereof and an input resistor connected at one end to the input terminal of said operational amplifier and at the other end to the current carrying conductor of said electrical system, the resistance of said input resistor being of a substantially larger value than the input impedance of said operational amplifier so as to establish, at the input of said operational amplifier, such a small fraction of a voltage appearing across said load impedance that said operational amplifier is virtually isolated from said electrical system, said operational amplifier generating a first output signal having a value proportional to the voltage across said load impedance;

c. means for multiplying said analog signal by said first output signal to generate a second output signal having a value proportional to instantaneous power in said electrical system;

d. means for converting said second output signal to a pulse train having a pulse repetition frequency proportional to the energy consumed in said electrical system; and e. means responsive to the pulse train from said means for converting for recording and displaying the energy consumed in said electrical system.

2. An electronic meter for measuring energy consumed in an electrical system of the type having a load impedance connected across reference and current carrying conductors of said system comprising:

a. means coupled to a current carrying conductor of said electrical system for generating a first analog signal having a value proportional to a current in said electrical system;

b. an operational amplifier having input and output terminals;

c. a feedback resistor connected across the input and output terminals of said operational amplifier;

d. an input resistor connected at one end to the input terminal of said operational amplifier and at the other end to the current carrying conductor of said electrical system, the resistance of said input resistor being of a substantially larger value than the input impedance of said operational amplifier so as to establish, at the input of said operational amplifier, such a small fraction of a voltage appearing across said load impedance that said operational amplifier is virtually isolated from said electrical system, said operational amplifier generating a second analog signal having a value proportional to the voltage across said load impedance;

e. means for generating a relatively high frequency triangular waveform signal;

f. means for comparing said high frequency triangular waveform signal with said second analog signal, said means for comparing generating a pulse width modulated signal having a pulse width proportional to the amplitude of said second signal;

g. means for multiplying said pulse width modulated signal from said means for comparing by said first analog signal, said means for multiplying generating a first output signal having a magnitude proportional to the current in said electrical system and further having a pulse width proportional to the magnitude of the voltage in said electrical system;

h. an integrator responsive to said first output signal from said means for multiplying for generating a second output signal having a value proportional to the energy consumed in said electrical system;

i. a pulse generating circuit for converting the second output signal from said integrator to a train of pulses, with each pulse being proportional to energy consumed in said electrical system; and j. a means responsive to said train of pulses for recording and displaying the electrical energy consumed in said electrical system.

3. The electronic meter of claim 2 further comprising error correction means, said error correction means comprising an inverting means connected to the output of said means for comparing;

switching means for selectively coupling the output of said means for comparing or the output of said inverter to said means for multiplying; and means responsive to said train of pulses of said pulse generating circuit for operating said switching means to reverse the phase of the pulse width modulated signal coupled to said means for multiplying.

4. The electronic meter of claim 3 wherein said pulse generating circuit comprises means for detecting when the voltage level of the second output signal of said integrator reaches a predetermined positive level;

means for detecting when the second output signal of said integrator reaches a predetermined negative level; and means responsive to said means for detecting for generating an output pulse when said predetermined positive and negative levels are reached.

5. The meter of claim 4 wherein said means for multiplying comprises a switch, said switch selectively connecting said first analog signal or a signal 180° out of phase with respect to said first analog signal to said integrator in accordance with the pulse width modulated signal generated by said means for comparing.

6. An electronic meter for measuring energy consumed in a polyphase electrical system of the type having a reference conductor and current carrying conductors, the several phases of the system being defined by a separate load impedance connected across the reference conductor and each of the individual current carrying conductors, said electronic meter comprising:

a. a plurality of means, one for each phase of said polyphase electrical system, each coupled to a corresponding one of said current carrying conductors, said plurality of means each generating an analog signal having a value proportional to phase current in their corresponding conductors;

b. a plurality of operational amplifiers, one for each phase of said polyphase electrical system, each having a feedback resistor connected across input and output terminals thereof and each further having an input resistor connected at one end to its input terminal and at the other end to a corresponding one of said current carrying conductors, the resistance of each input resistor being of a substantially larger value than the input impedance of its connected amplifier so as to establish, at the input of each of said plurality of operational amplifiers, such a small fraction of a voltage appearing across the load impedance of each phase that each operational amplifier is virtually isolated from said electrical system, each of said operational amplifiers generating an output signal having a value proportional to the voltage across the load impedance corresponding to the phase to which each amplifier is connected;

c. means for generating a relatively high frequency triangular waveform signal;

d. a plurality of comparators, one for each phase of said polyphase electrical system, said plurality of comparators each receiving said high frequency triangular waveform signal and each further receiving the output signal from a corresponding one of said plurality of operational amplifiers, each of said plurality of comparators generating a pulse width modulated output signal wherein the output from each comparator has a pulse width proportional to the amplitude of the voltage across the load impedance of its corresponding phase as depicted by the output signal of each comparator's corresponding operational amplifier;

e. a plurality of multiplying means, each corresponding to one phase of said polyphase electrical system, each multiplying means multiplying a one of said pulse width modulated output signals with a corresponding one of said analog signals to generate an output signal having an amplitude proportional to the magnitude of the electrical current in the current carrying conductor of its corresponding phase and further having a pulse width proportional to the magnitude of the voltage appearing across the load impedance of its corresponding phase;

f. means for summing the output signals of said plurality of multiplying means;

g. an integrator coupled to said means for summing for generating an output signal proportional to the energy consumed in said polyphase electrical system;

h. a pulse generating circuit coupled to the output of said integrator for converting the output signal therefrom to a pulse train, with each pulse corresponding to a quantized amount of electrical energy consumed in said polyphase electrical system; and i. means responsive to said pulse train for recording and displaying the total amount of energy consumed in said polyphase electrical system.

7. The electronic meter of claim 6 further comprising error correction means, said error correction means including an inverting means connected to the output of each comparator;

switching means for selectively connecting the output of each comparator or the output of each inverting means to an associated multiplying means corresponding to each phase of said polyphase electrical system; and means for controlling said switching means to reverse the polarity of the pulse width modulated output signal coupled from each comparator to a corresponding multiplier means of each phase of said polyphase electrical system.

8. The electronic meter of claim 7 wherein said pulse generating circuit comprises means for determining when the voltage level of the output signal of said integrator reaches a predetermined positive level;

means for detecting when the voltage level of the output signal of said integrator reaches a predetermined negative level; and means responsive to said means for detecting for generating an output pulse when said predetermined positive and negative levels are reached.

9. The meter of claim 8 wherein said multiplying means each comprises a switch, said switch selectively connecting said analog signal or a signal 180° out of phase with respect thereto to said integrator in accordance with the pulse width modulated signal generated by each comparator.

* * * * *